US008313812B2

(12) United States Patent
Coak et al.

(10) Patent No.: US 8,313,812 B2
(45) Date of Patent: Nov. 20, 2012

(54) DURABLE TRANSPARENT COATINGS FOR AIRCRAFT PASSENGER WINDOWS

(75) Inventors: Craig E. Coak, Kenmore, WA (US); Vasan S. Sundaram, Issaquah, WA (US); Warren W. Wascher, Kent, WA (US)

(73) Assignee: The Boeing Company, Chicago, IL (US)

( * ) Notice: Subject to any disclaimer, the term of this patent is extended or adjusted under 35 U.S.C. 154(b) by 1974 days.

(21) Appl. No.: 11/289,920

(22) Filed: Nov. 30, 2005

(65) Prior Publication Data

US 2007/0122598 A1 May 31, 2007

(51) Int. Cl.
*H05H 1/24* (2006.01)
(52) U.S. Cl. ..................... 427/569; 427/578
(58) Field of Classification Search .......... 427/569, 427/578, 248.1
See application file for complete search history.

(56) References Cited

U.S. PATENT DOCUMENTS

| | | | |
|---|---|---|---|
| 5,190,807 A * | 3/1993 | Kimock et al. | 428/216 |
| 5,344,712 A | 9/1994 | Chia-Cheng et al. | |
| 5,443,914 A | 8/1995 | Hart et al. | |
| 5,462,806 A | 10/1995 | Konishi et al. | |
| 5,618,619 A * | 4/1997 | Petrmichl et al. | 428/334 |
| 5,679,413 A * | 10/1997 | Petrmichl et al. | 427/534 |
| 5,846,649 A * | 12/1998 | Knapp et al. | 428/334 |
| 6,077,569 A * | 6/2000 | Knapp et al. | 427/534 |
| RE37,294 E * | 7/2001 | Knapp et al. | 427/534 |
| 2007/0122598 A1 | 5/2007 | Coak et al. | |
| 2007/0196633 A1 | 8/2007 | Coak et al. | |

FOREIGN PATENT DOCUMENTS

| | | |
|---|---|---|
| EP | 0675156 | 10/1995 |
| EP | 0675156 A | 10/1995 |
| WO | WO2006/049794 | 5/2006 |
| WO | WO2006049794 A2 | 5/2006 |
| WO | WO2008124559 A2 | 10/2008 |

OTHER PUBLICATIONS

International Search Report on related PCT application (PCT/US2008/059344) from International Searching Authority (EPO) dated Nov. 26, 2008.
Written Opinion on related PCT application (PCT/US2008/059344) from International Searching Authority (EPO) dated Nov. 26, 2008.
G. Philipp and H. Schmidt, New Materials for Contact Lenses Prepared From SI- and TI-alkoxides by the SOL-Gel Process, Journal of Non-Crystalline Solida, 1984, pp. 283-292, vol. 63.
Y. Qi et al., Comparison of Silicon Dioxide Layers Grown From Three Polymethylisiloxane Precursors in a High-Density Oxygen Plasma, J. Vac. Sci. Technol. A 21(4), Jul./Aug. 2003, pp. 1064-1068.
EP Communication dated Oct. 8, 2009, 2 pages.
Amendment pursuant to request for continued examination dated Sep. 9, 2011 regarding U.S. Appl. No. 11/696,661, 30 Pages.
USPTO final office action dated Nov. 17, 2010 ~regarding U.S. Appl. No. 11/696,661, 11 Pages.
Response to office action dated Sep. 14, 2010 regarding U.S. Appl. No. 11/696,661, 11 Pages.

(Continued)

*Primary Examiner* — Kelly M Gambetta
(74) *Attorney, Agent, or Firm* — Yee & Associates, P.C.

(57) ABSTRACT

A duplex coating scheme and associated method of formation, which includes a siloxane based soft coating and a plasma based SiOxCy hard coating used in combination to improve the durability of acrylic substrates used in aircraft window applications.

7 Claims, 6 Drawing Sheets

OTHER PUBLICATIONS

PCT search report dated May 15, 2007 regarding PCT/US2006/045840, 2 Pages.

USPTO office action for U.S. Appl. No. 11/696,661 dated Jul. 8, 2010.

* cited by examiner

DURABLE TRANSPARENT COATINGS FOR AIRCRAFT PASSENGER WINDOWS

BACKGROUND OF THE INVENTION

1. Field of the Invention

This invention relates to protective coatings for stretched acrylic windows, and more particularly to protective coatings which maintain the optical quality and reduces crazing of the windows in use.

2. Background

Aircraft passenger windows are typically made of stretched acrylic (i.e. acrylic substrate) due to its light weight, flexibility and formability. However, acrylic is susceptible to particle (e.g. sand) and water induced erosion and crazing. Moreover, during flight, aircraft windows are subjected to differential pressures caused by the difference in pressure between the inside and the outside of the aircraft. The differential pressure causes the windows to flex, and therefore can cause most coatings to crack, allowing chemicals to attack the acrylic substrate and in some cases allowing the coating to delaminate from the acrylic substrate.

Windows can also be subjected to a variety of chemicals, such as detergents and other chemicals used in aircraft maintenance.

Presently, acrylic and other types of aircraft windows are protected by sol-gel based polysiloxane coatings. The sol-gel coatings are homogeneous mixtures of a solvent, an organosilane, alkoxide and a catalyst that are processed to form a suitable coating.

The sol-gel coatings provide high transmittance, but limited durability against wear and UV induced degradation. The sol-gel coatings exhibit only a moderate durability as judged from field results. This is evident in FIG. 1 where the hard coating is not present over a major portion of a window 100 taken off an airline that was in service for about four years. Extensive scratches and crazing 102 can also be seen.

Therefore, there is a need for a transparent, hard coating with improved durability that would extend window life time. The improved coating should also provide improved resilience against chemicals commonly encountered in aircraft maintenance and also improved weatherability characteristics.

SUMMARY OF THE INVENTION

The present invention provides a duplex coating scheme. In one aspect of the invention, the coating scheme includes a siloxane based soft coating and a plasma based $SiO_xC_y$ hard coating used in combination to improve the durability of aircraft windows.

To circumvent durability issues associated with the presently used siloxane (1, 2) based coatings, the present invention provides a duplex coating that exhibits flexibility, inertness to chemicals used in aircraft maintenance and extreme durability and resistance to crazing.

In one aspect of the invention, a duplex coating is provided which includes a polysiloxane adherent coating; and a plasma CVD based coating containing silicon. The polysiloxane adherent coating is applied to a surface of a stretched acrylic substrate. The plasma CVD based coating is deposited on the polysiloxane coated stretched acrylic substrate.

In another aspect of the present invention, a method of forming a duplex coating on a substrate is provided. The method includes depositing a polysiloxane adherent coating on a surface of a substrate; and depositing a plasma CVD based coating on the polysiloxane adherent coating.

The duplex coating of the present invention improves weatherability, resistance to chemical exposure, wear resistance and resistance to flexing induced crazing of stretched acrylic. The wear resistance of the duplex coating, as measured by Taber Wear testing (ASTM D 1044-99), has been shown to be more than an order of magnitude better than the currently used siloxane coatings. The duplex coating also improves flexing induced crazing of the acrylic substrates.

The optical properties (light transmittance in the visible region of the solar spectrum, clarity and haze) of an acrylic substrate with the duplex coating have been shown to be about the same as that of a window having a single polysiloxane coating.

Additional advantages, objects, and features of the invention will be set forth in part in the detailed description which follows. It is to be understood that both the foregoing general description and the following detailed description are merely exemplary of the invention, and are intended to provide an overview or framework for understanding the nature and character of the invention as it is claimed.

BRIEF DESCRIPTION OF THE DRAWINGS

The accompanying drawings are included to provide further understanding of the invention, illustrate various embodiments of the invention, and together with the description serve to explain the principles and operation of the invention. In the drawings, the same components have the same reference numerals. The illustrated embodiment is intended to illustrate, but not to limit the invention. The drawings include the following Figures.

DETAILED DESCRIPTION OF THE INVENTION

Figures 1, 2:
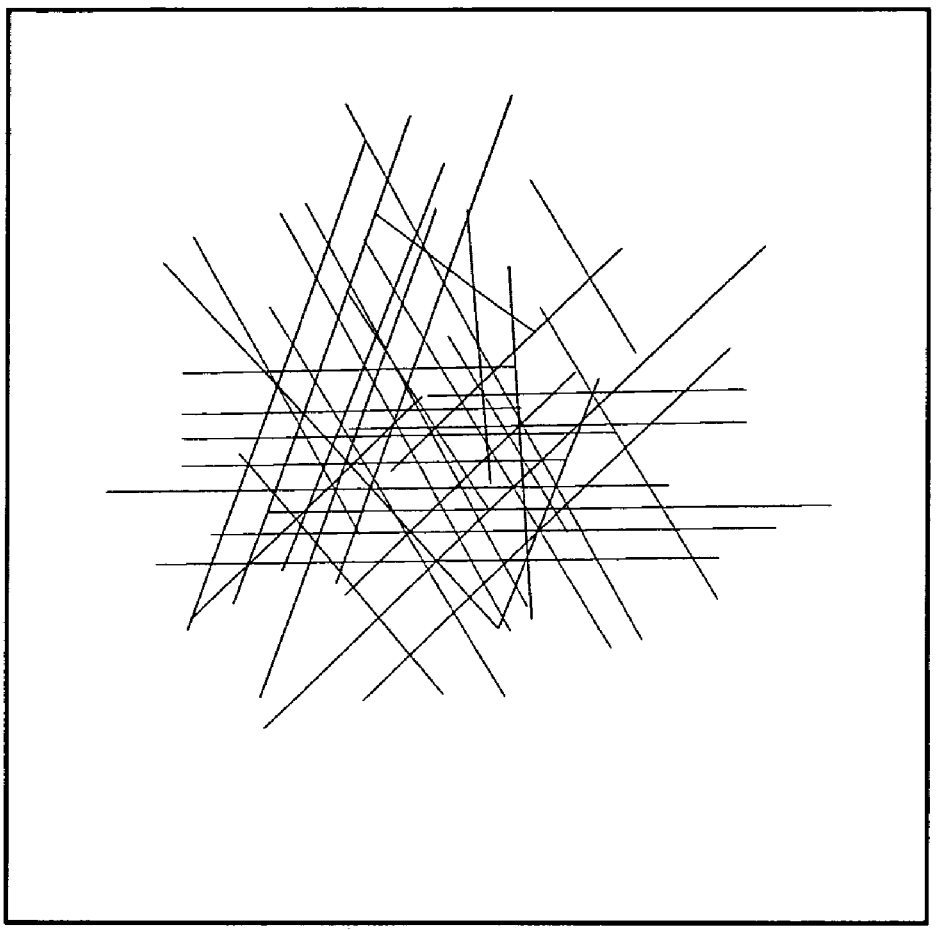
FIG. 1 is an example of a used window.
FIG. 2 is a simplified illustration of an acrylic substrate coated with a duplex coating in accordance with an embodiment of the present invention.

As illustrated in FIG. 2, the duplex coating 200 of the present invention includes the combination of a first coating 202 and a second coating 204 deposited onto a substrate 206, such as an acrylic substrate 206. In one embodiment, acrylic substrate 206 may be a common aircraft passenger window 100.

In one embodiment, second coating 204 is deposited onto acrylic substrate 206 using a plasma based Chemical Vapor Deposition (CVD) coating process. The plasma CVD coating is a relatively "hard" coating, which provides better wear resistance, chemical inertness and the like, than other coatings generated by wet chemical methods such as sol-gel coatings. The ion bombardment effects which occur during plasma CVD of silicon based transparent coatings have been shown to improve the hardness and durability of the coatings. The ion bombardment during deposition tends to enhance the surface mobility of the depositing species and hence improve the optical quality, from the point of view of haze and clarity, of the coating.

In accordance with the present invention, hard coating 204 may include a silicon based layer, such as for example, a $SiO_xC_y$ based layer or a Diamondshield layer available from Diamonex Inc.

Although the plasma CVD based or hard coating 204 has increased hardness and durability and improved optical characteristics, first coating 202 is provided to provide improved adhesion and flexibility characteristics to the plasma CVD based hard coating 204, which alone exhibits poor adhesion to acrylic substrate 206.

In accordance with the present invention, first coating or "soft" coating 202 may include an adherent polysiloxane based layer. Soft coating 202 provides a bonding layer and thus is formed prior to depositing hard coating 204. In combination, soft coating 202 combined with hard coating 204 form duplex coating 200 in accordance with the present invention.

Soft coating 202 need not be very thick to provide the above identified benefit to hard coating 204. In one embodiment, soft coating 202 may be between about 100 and 200 angstroms thick to be sufficient to ensure the adhesion of hard coating 204 to acrylic substrate 206. In one example, tests showed that stretched acrylic substrate 206 with a thick soft coating 202 on the order of 4 microns performed well in wear tests.

Referring again to FIG. 2, in one exemplary embodiment, stretched acrylic substrate 206 is first treated and coated with soft coating 202. In this embodiment, soft coating 202 includes a 4 micron thick polysiloxane based adherent transparent coatings.

Next, a silicon based transparent hard coating 204, for example, Diamondshield, is deposited on the soft coated acrylic substrate 206 using an ion assisted plasma process. The deposition process includes using silicon containing precursors, such as hexamethyldisiloxane and oxygen. The plasma CVD conditions, such as gas flow, deposition pressure, plasma power and the like, may be optimized to produce hard, transparent coatings in accordance with well known plasma CVD principles.

In one embodiment, acrylic substrate 206, prior to being loaded into a vacuum chamber for the application of hard coating 204, may be first chemically cleaned to remove contaminants such as hydrocarbons and other undesirable materials. The cleaning process may be accomplished using, for example, ultrasonic cleaning in solvents or aqueous detergents. Once the desired vacuum conditions are obtained, substrate 206 may be sputter cleaned using inert ions and or oxygen ions. Once the cleaning step is complete, the hard coat application can commence.

In one embodiment, for example in window applications, hard coating 204 may be between 4 and 5 microns thick.

Coating Performance Evaluation:

With no intent to limit the present invention, to validate the improved performance of duplex coating 200 versus the currently used polysiloxane coating in applications using acrylic substrates, the following comparisons are made.

To perform the comparison, a first group (Group I) of stretched acrylic substrates is coated with a polysiloxane coating to a thickness of about 4 microns. A second group (Group II) of stretched acrylic substrates is first coated with a polysiloxane coating to a thickness of 4 microns, followed by a plasma based hard coating to a thickness of about 5 microns to form the Duplex coated acrylic substrates of the present invention.

Figure 3:
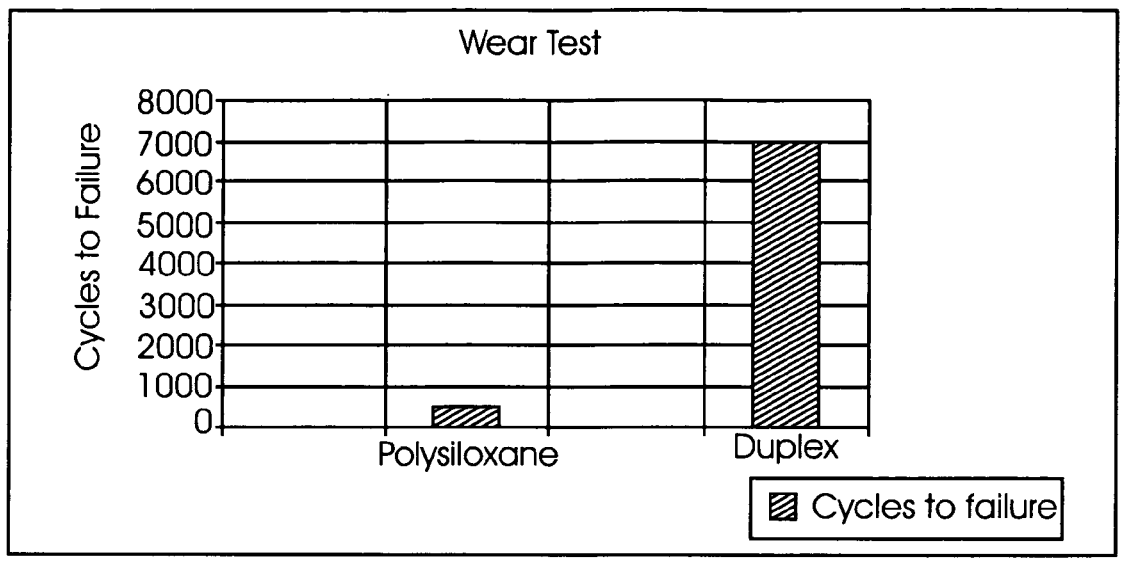
FIG. 3 is a graph showing Taber wear test results for stretched acrylic with polysiloxane and the duplex coating of the present invention.

Wear Test:

Coated substrates (Group I & Group II) are tested for wear in accordance with the procedure described in ASTM D-1044-99, "Standard Test Method for Resistance of Transparent Plastics to Surface Abrasion". This test consists of using two CS-10F wheels to which a predetermined load of 500 gm is applied to each. The wheels are made to abrade the coated acrylic substrate surfaces as it rotates. The increase in haze is used as the criteria for measuring the severity of abrasion. The tests are run until the haze increased by 5% as a result of the abrasion. The results of tests are shown in FIG. 3. As shown in the graph of FIG. 3, duplex coatings exhibit improvement in wear resistance by more than an order of magnitude when compared to a polysiloxane coating.

Figure 4:
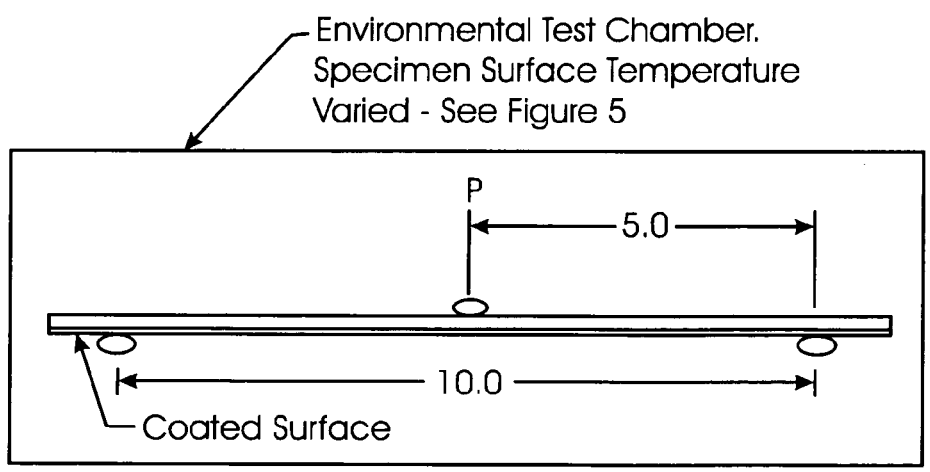
FIG. 4 is a simplified schematic of a three point flex test.
Figure 5:
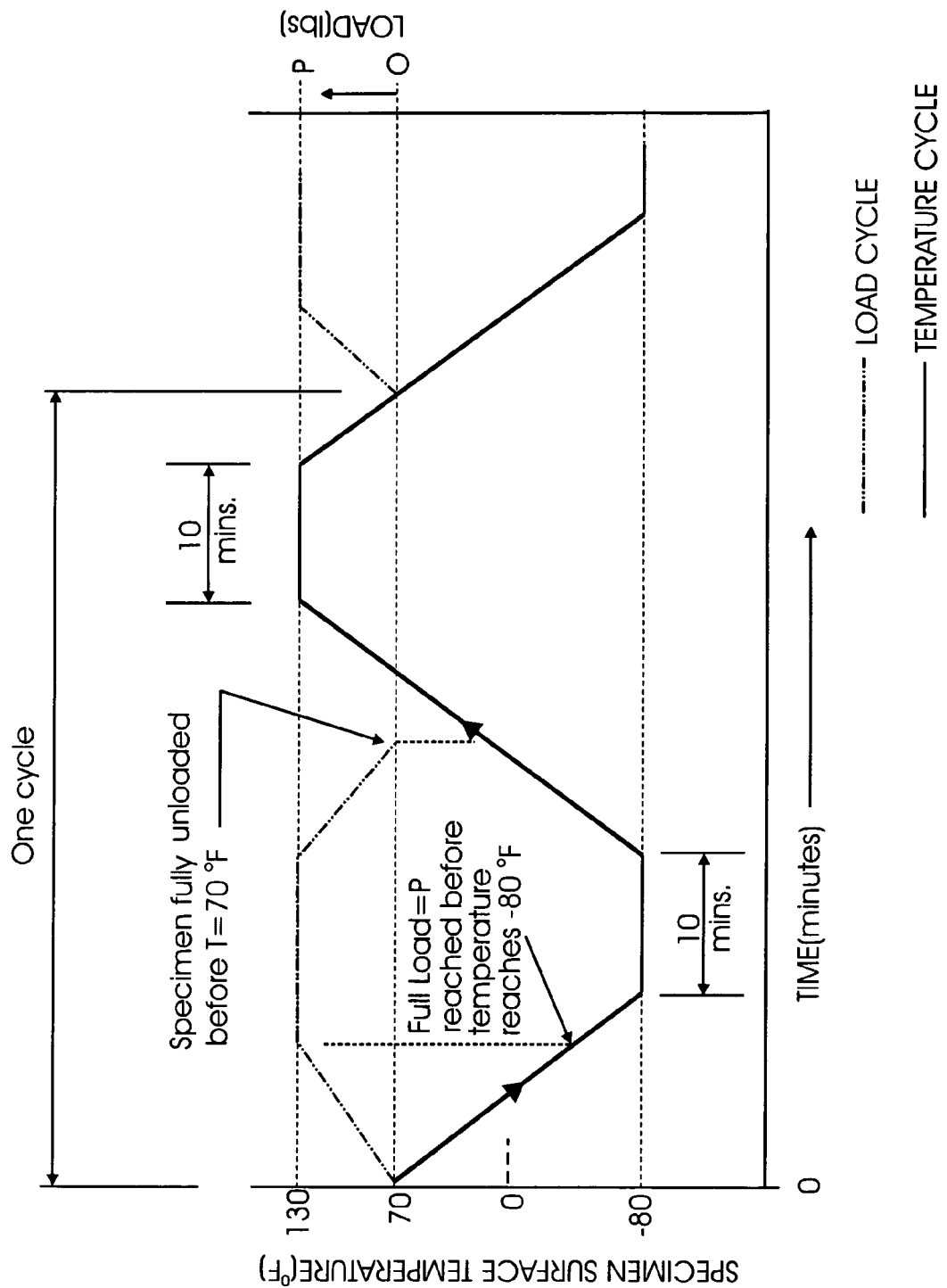
FIG. 5 is a simplified schematic of a Load/Temperature Flex Test Cycle for Coated Acrylic Coupons in accordance with an embodiment of the present invention.

Flex Test:

A modified ASTM D-790 test protocol is used in conducting the flex tests of coated components. Samples of dimensions 1"×12"×0.5" with coatings (Group I & II) are subjected to a three point bend test as shown in FIG. 4. The side with the hard coating is facing downwards in this figure. A thin film of 75 wt % sulfuric acid in water is applied to the coating using a fiber glass filter and a Teflon tape. The test article is subjected to a cyclic load/temperature profile as shown in FIG. 5. An ultimate load of 3600 PSI is used in these tests. The tests are continued until the coating cracks or the surface exhibits crazing (whichever occurs first). The results show that while the polysiloxane coated substrates (Group I) failed in 50 cycles, the Duplex coated substrates (Group II) of the present invention show no crack or craze even after 500 cycles.

Figure 6:
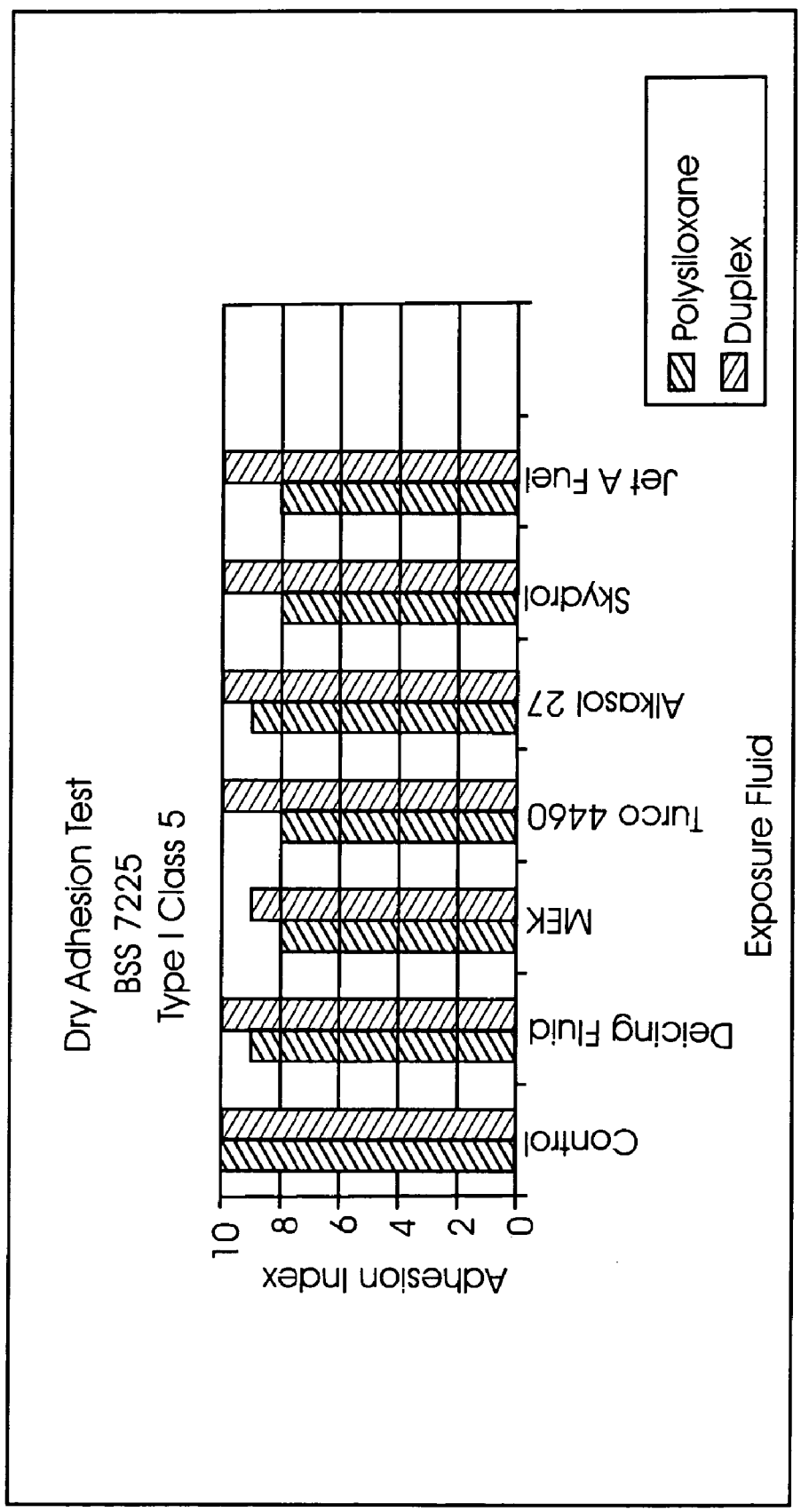
FIG. 6 is a graph showing change in dry adhesion index as a result of exposure to various chemicals (marked in the figure) for 24 hours of a polysiloxane and duplex coated stretched acrylic in accordance with an embodiment of the present invention.
Figure 7:
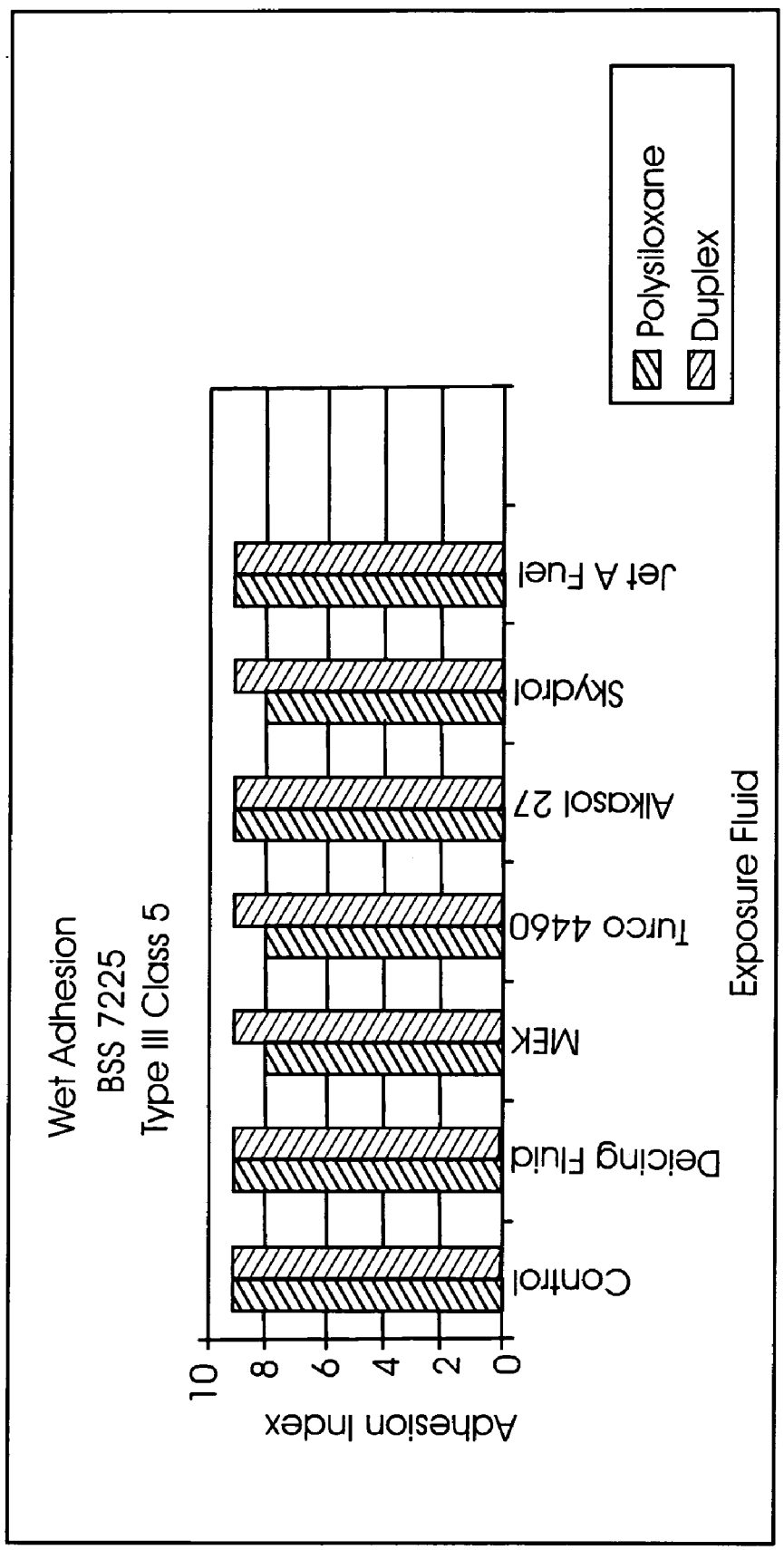
FIG. 7 is a graph showing change in wet adhesion index as a result of exposure to various chemicals (marked in the figure) for 24 hours of a polysiloxane and duplex coated stretched acrylic in accordance with an embodiment of the present invention.
Figure 8:
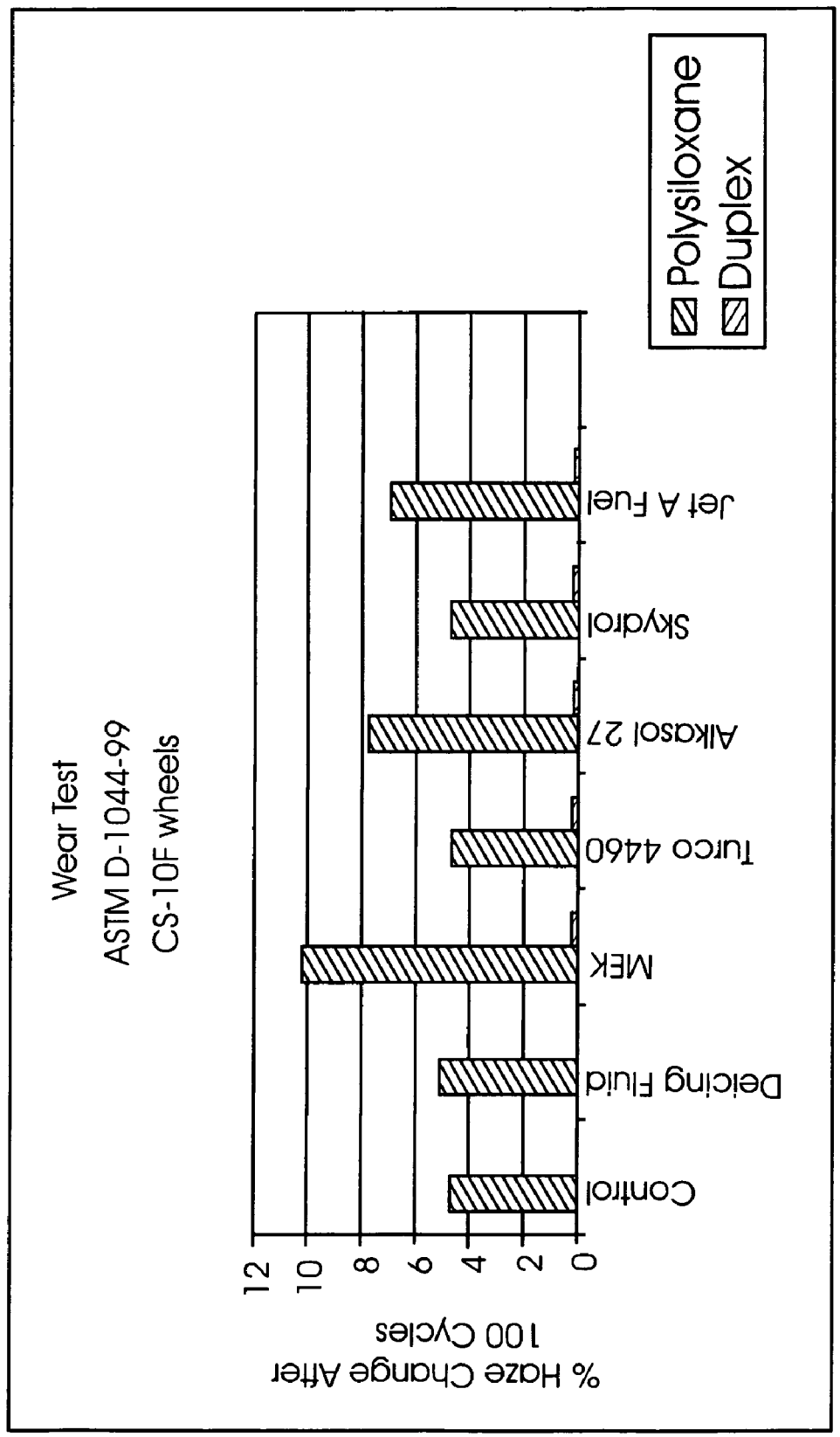
FIG. 8 is a graph showing Taber wear test results after chemical exposure for a polysiloxane and duplex layer coated stretched acrylic in accordance with an embodiment of the present invention.

Chemical Exposure Test:

Stretched acrylic substrates with duplex coating in accordance with the present invention are exposed to chemicals that are normally used in the performance of aircraft maintenance. The samples are exposed to each chemical for a period of 24 hours (exception: exposure to MEK was for 4 hours) and then tested for adhesion (modified ASTM D 3330-BSS 7225) and % haze change due to wear when tested per ASTM D-1044-99. The results are shown in FIGS. 6, 7, and 8 for the polysiloxane coated substrates (Group I) and the duplex coated substrates (Group II). The samples with duplex coatings exhibit no degradation in adhesion (as indicated by adhesion index) or wear induced haze change as a result of chemical exposure.

UV/Humidity Exposure:

Coated (Group I & Group II) substrates are exposed to ultraviolet light (UV-A lamp with peak wavelength at 340 nm)/humidity for a total exposure of 300 KJ/m2 in accordance with SAE J1960. The exposure consists of 40 minute light, 20 minute light with front spray, 60 minute light and 60 minute dark with front and back spray. Another set of samples from Groups I & II are first exposed to various chemicals (per chemical test above) and then subjected to UV/Humidity test protocol. In both of these tests, the samples with the duplex coating showed no degradation as a result of UV/humidity exposure and performed better than those with single polysiloxane coating alone.

Accordingly, the scope of the present invention should not be limited to the particular embodiments illustrated and described herein, as they are merely exemplary in nature, but rather, should be fully commensurate with that of the claims appended hereafter and their functional equivalents.

What is claimed is:

1. A method of forming a duplex coating on a substrate, the method comprising:
   depositing a polysiloxane adherent coating on a surface of the substrate; and
   depositing a transparent hard coating of $SiO_xC_y$ on said polysiloxane adherent coating using a plasma based chemical vapor deposition process.

2. The method of claim 1, wherein said substrate comprises a stretched acrylic substrate.

3. The method of claim 1, wherein the polysiloxane adherent coating comprises a thickness of between about 4 and 5 microns.

4. The method of claim 1, wherein the plasma based chemical vapor deposition coating comprises a thickness of between about 4 and 5 microns.

5. The method of claim 1, further comprising:
   cleaning said polysiloxane adherent coated substrate to remove contaminants.

6. The method of claim 5, wherein said cleaning comprises ultrasonic cleaning in solvents or aqueous detergents.

7. The method of claim 5, wherein said cleaning comprises sputter cleaning in a vacuum environment using inert ions and/or oxygen ions.

\* \* \* \* \*